United States Patent [19]

Yamashita et al.

[11] Patent Number: 4,801,518

[45] Date of Patent: Jan. 31, 1989

[54] METHOD OF FORMING A PHOTORESIST PATTERN

[75] Inventors: Yoshio Yamashita; Ryuji Kawazu; Toshio Itoh; Takateru Asano; Kenji Kobayashi, all of Tokyo, Japan

[73] Assignee: Oki Electric Industry, Co., Ltd., Tokyo, Japan

[21] Appl. No.: 129,936

[22] Filed: Dec. 3, 1987

Related U.S. Application Data

[63] Continuation-in-part of Ser. No. 851,525, Apr. 14, 1986, abandoned.

[30] Foreign Application Priority Data

Apr. 18, 1985 [JP] Japan .................................. 60-83070
Jul. 31, 1985 [JP] Japan .................................. 60-169510

[51] Int. Cl.$^4$ ................................................ G03F 7/26
[52] U.S. Cl. ..................................... 430/325; 430/190; 430/191; 430/330; 430/331
[58] Field of Search ............... 430/325, 190, 191, 330, 430/331

[56] References Cited

U.S. PATENT DOCUMENTS

| | | | |
|---|---|---|---|
| 2,697,039 | 12/1954 | Martinson | 430/302 |
| 2,929,708 | 2/1960 | Straw | 430/28 |
| 3,046,114 | 7/1962 | Sus | 430/193 |
| 3,046,120 | 7/1962 | Schmidt et al. | 430/190 |
| 3,502,470 | 3/1970 | Delzenne et al. | 430/190 |
| 3,644,118 | 2/1972 | Agnihotri | 430/190 |
| 4,196,003 | 4/1980 | Watanabe | 430/191 |
| 4,212,935 | 7/1980 | Canavello | 430/326 |
| 4,491,628 | 1/1985 | Ito et al. | 430/325 |
| 4,571,395 | 2/1986 | Banedikt | 430/325 |
| 4,600,684 | 7/1986 | Yamashita et al. | 430/325 |
| 4,609,615 | 9/1986 | Yamashita et al. | 430/325 |

FOREIGN PATENT DOCUMENTS

844039 8/1960 United Kingdom .

OTHER PUBLICATIONS

D. J. Elliott: "Integrated Circuit Fabrication Technology", 1982, pp. 186–189, McGraw Hill, New York, US.
IBM Technical Disclosure Bulletin, vol. 23, No. 3, Aug. 1980, p. 1004; B. K. Bergin et al "Increased Film Thinning Ratios for Resist by Emulsion Development".
IBM Tech. Discl. Bulletin, vol. 16, No. 2, Jul. 1973, p. 3717, NY, J. J. Difazio et al: "Positive Photoresist Development Process".
IBM Tech. Discl. Bulletin, vol. 14, No. 12, May 1982, p. 3717, NY, M. W. MacIntyre et al: "Organic Developer for Positive Photoresists".
Microelectric Engineering, vol. 1, No. 4, Dec. 1983, pp. 269–293, Elsevier Sci. Publ., Amsterdam, NL: S. A. MacDonald et al., "Advances in the Design of Organic Resist Materials".

*Primary Examiner*—Charles L. Bowers, Jr.
*Attorney, Agent, or Firm*—Wenderoth, Lind & Ponack

[57] ABSTRACT

A method of forming a photoresist pattern wherein a photoresist coating film of naphthoquinone diazide sulfonate of novolak is formed on a substrate layer, the photoresist coating film is exposed by selectively irradiating with near ultraviolet radiation of 350 to 450 nm through a photomask, and the exposed photoresist coating film is developed with an either a negative type or positive type developing solution. The resultant photoresist pattern is usable for manufacturing a highly integrated circuit such as LSI which requires fine processing techniques.

6 Claims, 2 Drawing Sheets

FIG_1A
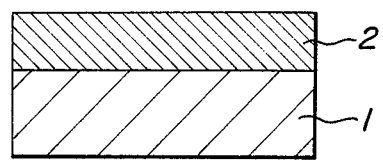
FIG_1B
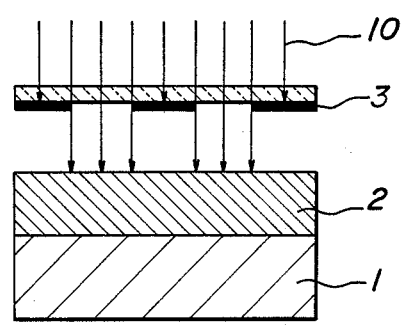
FIG_1C
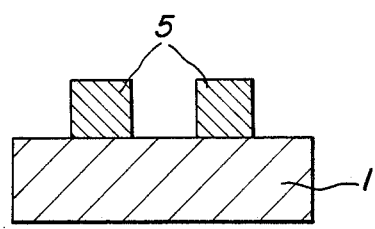

METHOD OF FORMING A PHOTORESIST PATTERN

This application is a continuation-in-part, of now abandoned application Ser. No. 851,525, filed Apr. 14, 1986.

BACKGROUND OF THE INVENTION

1. Field of the Invention

The present invention relates to a method of forming a photoresist pattern. The photoresist pattern is specifically used for manufacturing semiconductor devices with a submicrometer resolution.

2. Description of the Prior Art

In the semiconductor technical field, there is a growing need for a higher integration of semiconductor devices. Accordingly, there is a severe technical demand for the production of fine photoresist patterns. One of the fine processing methods employs ionization radiation such as electron beams, X-rays, shortwavelength ultraviolet radiation, and the like, so as to form the photoresist pattern, and thereafter precisely transferring the photoresist pattern onto underlying layers, e.g., substrates by a dry-etching treatment in which ions or a plasma has been filled.

As a transfer apparatus for forming a photoresist pattern for a fine process, an optical reduction type transfer apparatus (aligner) has been mainly used because of its properties of high resolution and high accuracy for alignment. As a light source for this type of transfer apparatus, a g-line emitted from a mercury vaper lamp and being in a region, of near ultraviolet region is most expected in view of its lower absorption in the optical system and higher light outputs.

However, as a positive type photoresist for photolithography using the near ultraviolet radiation, a photoresist is used which is obtained by mixing a novolak resin and a naphthoquinone diazide of a photosensitive material due to its high resolution and dry etching resistance. Further, as a negative type photoresist, a photoresist obtained by mixing a polyvinyl phenol and a bisazide is used. This resist has high sensitivity at the i-line (365 nm).

However, because light of a g-line (436 nm) is most expected as a light source for the optical reduction type transfer apparatus, the sensitivity of resins above the negative type photoresist is low. Further, the positive type photoresists pose difficulties in maintaining a good line width control over the topography because of the reflective notching caused by reflected light from the substrate.

If negative and positive type photoresist patterns can be formed by selecting the proper developing solutions, it is possible to select a method by which a negative or positive type photoresist pattern can be easily obtained in accordance with the photoresist pattern. As a result, various merits are achieved in the manufacture of semiconductor devices.

It is therefore an object of the present invention to provide a method of forming a negative or positive type photoresist pattern by using the proper negative or positive type developing solution and for forming a constant line width pattern even over the substrate topography.

SUMMARY OF THE INVENTION

The object of the invention may be accomplished by providing a method of forming a photoresist pattern according to the following steps.

A coating film of naphthoquinone diazide sulfonate of novolak as a photoresist coating film is firstly formed on a substrate or other underlying layer.

Then, this coating film is exposed by irradiating with near ultraviolet radiation of from 350 to 450 nm through a photomask of a desirable pattern, which is to be copied onto the coating film.

In this case, if the light wavelength is below 350 nm, a negative pattern can be formed, but a positive pattern can not be formed. If the light wavelength is above 450 nm, the resist is not sensitized. Accordingly, a light source having the above wavelength region is used.

Subsequently, when the negative pattern is formed, the irradiated coating film is developed with a negative type developing solution. To the contrary, when a positive pattern is formed, the irradiated coating film is developed with a positive type developing solution.

Through such treating steps, it is possible to form the desired negative or positive type photoresist pattern on an underlying layer.

According to the invention, it is preferable to use a developing solution of a nonpolar solvent such as a halogen-containing solvent and/or alkyl benzene solvent as the negative type developing solution. Otherwise, the negative type developing solution is preferably a solution which is made by mixing the nonpolar solvent with one or more solutions selected from the group consisting of cyclohexane, n-hexane and petroleum ether.

In the preferred embodiment of the present invention, the halogen-containing solvent is selected from of one or more solvents from the group consisting of monochlorobenzene, trichloroethylene, chloroform, dichloromethane and dichloroethane.

Further, in a preferred embodiment of the present invention, the alkyl benzene solvent is selected from one or more solvents from the group consisting of xylene, toluene and benzene.

Further, the positive type developing solution preferably contains one or more solvents selected from the group consisting of alcohol solvents, mixed solvents of acetate and alcohol, and mixed solvents of alkyl ketones and alcohol.

In a preferred embodiment of the present invention, the alcohol solvent is consists of one or more solvents selected from the group consisting of isopropyl alcohol, n-butyl alcohol and methanol.

Further, in the embodiment of the present invention, it is preferable to select isoamyl acetate from the group of the acetates and also to select methylisobutyl ketone from the group of alkyl ketones.

As described above, according to the present invention, it is possible to form a photoresist coating film of a naphthoquinone diazide sulfonate of a novolak, expose the photoresist coating film by irradiating with near ultraviolet radiation, and to selectively use a negative or a positive type developing solution for the exposed photoresist coating film in accordance with the desirable pattern to be formed.

BRIEF DESCRIPTION OF THE DRAWINGS

These and other feature and advantages of the present invention will become readily apparent from the following detailed description of embodiments of the present invention, particularly when taken in connection with accompanying drawings wherein like reference numerals designate like or functionally equivalent parts throughout, and wherein:

FIGS. 1A to 1C are sectional views illustrating the steps of forming a negative type photoresist pattern according to the present invention.

DETAILED DESCRIPTION OF THE PREFERRED EMBODIMENTS

Figure 2A:
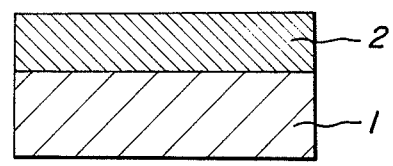
FIGS. 2A to 2C are sectional views illustrating the steps of forming a positive type photoresist pattern according to the present invention.

A detailed description will now be made of the preferred embodiments according to the invention.

It should be understood that the invention is not restricted to the specific embodiments of materials, numerical datum, etc., since similar effects can be achieved as those obtained by substituting other materials, numerical datum, etc. therefor.

EXAMPLE I

Referring to FIGS. 1A to 1C, naphthoquinone diazide sulfonate of novolak (referred as "NQN") was dissolved into methyl cellosolve acetate at the rate of 10 to 40 weight %, this solution was then filtered through a filter (not shown) having a throughhole diameter of 0.2 μm and applied onto a silicon wafer 1 by way of a spin coating method, thereby forming the coating film 2 having a thickness of 0.7 μm. This silicon wafer 1 functions as a base or underlying layer.

Then, this silicon wafer 1 having a photoresist coating film 2 of NQN was prebaked at a temperature of 70° C. for about 30 minutes. Thereafter, the resist coating film 2 of NQN was treated by exposing with the g-line of a 250 W mercury lamp of a 1/5 optical reduction type aligner (not shown in detail). The exposure dose was 50 mJ/cm$^2$. Accordingly, a photomask pattern 3 was transferred onto the NQN coating film 2. Thereafter, the wafer 1 having the exposed NQN coating film 2 was interbaked at a temperature range of 60° to 130° C., preferably 100° C. for approximately 30 minutes.

Such an interbaking treatment to the exposed NQN coating film 2 increases its sensitivity without lowering its resolution.

According to this example, this NQN coating film 2 was developed for 35 seconds by employing a mixture type developing solution containing a volume rate of 10:1 of monochlorobenzene and cyclohexane. The temperature of this developing solution was 23° C. Subsequently, the coating film 2 was rinsed in cyclohexane for 10 seconds, so that concaves (not shown) were formed in the unexposed surface portions of the substrate or wafer 1, to which no ultraviolet radiation 10 had been projected because these portions were located under the photomask 3. Thus, a negative type photoresist pattern 5 was fabricated.

Such a negative type photoresist pattern 5 has a clean, sharp and rectangular sectional plane and also can be resolved to a 0.6 μm line and space pattern as observed with a scanning electron microscope.

EXAMPLE II

In this example, a substrate consisting of a silicon wafer and an aluminum layer formed thereon instead of the silicon wafer 1 as described in FIG. 1 was employed and the same film forming process as in the Example I was conducted.

As a result of this example, it can be seen that the resultant photoresist pattern can be resolved to a 0.7 μm line and space pattern when observed by a scanning electron microscope.

EXAMPLE III (Heat Resistance Experiments)

The photoresist pattern fabricated according to the Example I was baked at a temperature of 150° C. for 30 minutes. The edge portion of the baked photoresist pattern was not deformed when observed by a scanning electron microscope.

For the sake of comparison, Az-1350J (i.e., the photoresist commercially available from Shipley corporation) was applied to the same substrate under the same conditions to form a conventional photoresist pattern. When a conventional photoresist pattern was baked at a temperature of 150° C., the edge portion thereof was deformed so that the sectional plane of the photoresist pattern was rounded.

EXAMPLE IV

First, the photoresist film was formed according to the same method as in the Example I, and then exposed at an exposure dose of 100 mJ/cm$^2$. The exposed film was developed by using a developing solution consisting of a 10:1 volume ratio of xylene to cyclohexane at a temperature of 23° C. for 60 seconds. After the developed film was rinsed in cyclohexane, a negative type photoresist pattern can be obtained having a resolution of a 0.7 μm line and space.

EXAMPLE V

A naphthoquinone diazide sulfonate of a novolak (NQN) was dissolved into methyl cellosolve acetate at the rate of 25 weight %, this solution was then filtered through a filter having a throughhole diameter of 0.2 μm and applied onto the silicon wafer in a coating thickness of 0.8 μm by using a spin coating method.

Then, this silicon wafer having a photoresist coating of NQN was prebaked at a temperature of 60° C. for about 30 minutes. After this prebaking, the resist coating of NQN was treated by contact-exposing with a 250 W mercury lamp. The dose amount was 100 mJ/cm$^2$. The exposed film was developed by using trichloroethylene at a temperature of 23° C. for 30 seconds and rinsed with cyclohexane at a temperature of 23° C. for 15 seconds. Then a negative type photoresist pattern was obtained. It was observed that the negative type photoresist pattern was resolved to a 1.0 μm line and space pattern, and the thickness of the remaining coating film after development was 0.8 μm.

EXAMPLE VI

A coating of a naphthoquinone diazide sulfonate of novolak (NQN) was formed and exposed as described in Example V. The coating was developed by using a solution containing 3 parts by weight of chloroform and 1 part by weight of cyclohexane at a temperature of 23° C. for 15 seconds, and rinsed with cyclohexane for 15 seconds.

Then, a negative type photoresist pattern was obtained. It can be seen that the negative type photoresist pattern was resolved to a 1.0 μm line and space pattern.

The thickness of the remaining coating film after the development was 0.78 μm.

EXAMPLE VII

Referring back to FIGS. 1A to 1C, a silicon (Si) wafer 1 was prepared as a substrate. A naphthoquinone diazide sulfonate of a novolak (abbreviated as "NQN") as a photoresist material was used. This NQN was dissolved into methyl cellosolve acetate at a rate of 10 to 40 weight %. This solution was then filtered through a filter having a throughhole diameter of 0.2 μm and applied onto the silicon wafer 1, whereby the wafer 1 is coated by a film having a thickness of approximately 1 μm.

Then, this silicon wafer 1 having a photo resist coating film 2 of NQN was prebaked at a temperature of 70° C. for about 30 minutes. After this baking, the resist film 2 of NQN was exposed through a photoresist mask 3 having a desired mask pattern by a 1/5 optical reduction type transfer apparatus (NA: 0.35) equipped with g-line of 350 W mercury lamp as a light source. The dose time within a one exposure process was determined as 450 msec.

After this exposure, the resist film 2 formed on the substrate 1 was interbaked at a temperature in the order of 100° C. for approximately 30 minutes, and then developed.

This development was firstly conducted at a temperature of 23° C. for 50 seconds by use of a mixed solution having a 10:1.5 volume ratio of monochlorobenzene and cyclohexane as the first developing solution. As a result, a negative type photoresist pattern 5 was obtained (see FIG. 1C). It was recognized that the negative type pattern 5 could be resolved to a 0.6 μm line and space pattern by observing with a scanning type electron microscope.

EXAMPLE VIII

Figure 2B:
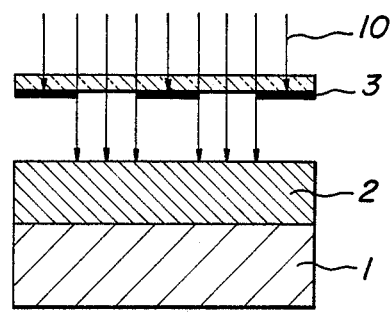
Figure 2C:
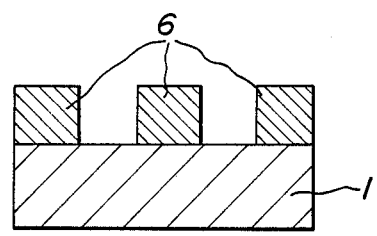

Referring now to FIGS. 2A to 2C, a description will be made of a second development with the same photoresist coating film 2 as in FIGS. 1A to 1C.

A mixed solution of a 1:1 volume ratio of isoamyl acetate acid and isopropyl alcohol were used as a second developing solution. The coating film 2 was developed with this second solution at a temperature of 23° C. for 30 seconds. As a result, a positive type photoresist pattern 6 was formed. It can be seen that the positive type pattern 6 was resolved to a 0.7 μm line and space pattern by observed with a scanning electron microscope.

As is apparent from the foregoing, in accordance with the present invention, that identical photoresist material can be employed to form either negative or positive photoresist patterns by merely choosing the type of developing solutions used.

EXAMPLE IX

In this example, as to the exposed resist coating film obtained by a series of photoresist films previously described in Example VII, the following development was conducted under the below mentioned developing solutions and developing conditions.

(1) A mixed developing solution containing a 1:1.5 volume ratio of isopropyl acetyl acetate and isopropyl alcohol was employed at a temperature of 23° C. and a developing time of 20 seconds.

(2) A mixed developing solution containing a 1:2 volume ratio of methylisobutyl ketone and isopropyl alcohol was used at a temperature of 23° C. and a developing time of 25 seconds.

(3) A mixed developing solution containing a 1:1.5 volume ratio of isoamyl acetate and n-butyl alcohol was utilized at a temperature of 23° C. and a developing time of 30 seconds.

In all three cases, positive type photoresist patterns could be obtained according to the invention.

EXAMPLE X

In this example, the resultant photoresist coating film as described in Example VII was contact-exposed with a mercury (Hg) lamp of 250 W. The exposure time was selected to be 10 seconds. After the heating treatment of the exposed photoresist at a temperature of 100° C. for 30 minutes, the photoresist was developed at a temperature of 23° C. for 50 seconds using a mixed developing solution containing 1:0.15 volume ratio of monochlorobenzene and isopropyl alcohol, thereby a negative type photoresist pattern being obtained. It can be seen that the negative type photoresist pattern was resolved to a 0.5 μm line and space pattern by observation with a scanning electron microscope.

EXAMPLE XI

A exposed photoresist coating film was developed at a temperature of 23° C. for 30 seconds by using a mixed developing solution containing a 1:1 volume ratio of isoamyl acetate and isopropyl alcohol. As a result, a positive type pattern photoresist was obtained. This positive type photoresist could be resolved to a 0.5 μm line and space.

As is understood from the above mentioned Examples, in case of forming the negative and positive type photoresist patterns, there is an advantage that the photoresist patterns of high resolution are obtained since a NQN film does not swell with the developing solution.

Another advantage is that, in case of forming the photoresist patterns on the reflective and/or steped surface of the underlying layer, the mask patterns are precisely transferred onto the photoresist coating film, thereby forming correct, clean and sharp photoresist patterns, since the light absorption coefficient of the NQN film to the exposure radiation of the wavelength range of 350 to 450 nm is large and therefore the sensitivity of the NQN film is high and the patterning precision is not influenced by the light reflected from the surface of the underlying layer.

A further advantage is that the edge portions of the photoresist patterns are not deformed when baked at a temperature of the order of 200° C. since the NQN film has better heat resistance at a temperature in the order of 200° C.

A still further advantage is that the underlying layer having formed thereon the photoresist patterns can be subjected to a plasma etching treatment, since the NQN material has excellent resistance to dryetching.

The following Experimental Example will illustrate why the photoresist coating film is irradiated with ultraviolet radiation at a wavelength of 350–450 nm, especially as opposed to lower values.

EXPERIMENTAL EXAMPLE

A naphthoquinone diazide sulfonate of a novolak (NQN) was dissolved into methyl cellosolve acetate in the amount of 25 weight percent. This solution was then applied onto a silicon wafer by using a spin coating method. This silicon wafer having a photoresist coating of NQN was baked in an oven at a temperature of 60° C. for 30 minutes. The thickness of the photoresist coating of the NQN was 1 μm. Then, the resist coating of NQN was exposed with light through a filter from a 250 W mercury lamp or a 500 W Xe-Hg lamp. The exposed film was dipped into a solution of isoamyl acetate so as to observe whether or not the photoresist was dissolved in the solution. The results of the experiments are shown in the following Table 1.

TABLE 1

| Condition of the Exposure | Dose Amount | Dissolvability |
|---|---|---|
| (1) No exposure | | dissolves |
| (2) Cutting of wavelengths λ below 350 nm (filter used: UV-34, HOYA Co., Ltd.) | 2 J/cm$^2$ | dissolves |
| (3) Cutting of wavelengths λ below 300 nm (filter used: UV-30, HOYA Co., Ltd.) | 300 mJ/cm$^2$ 2 J/cm$^2$ | dissolves does not dissolve |
| (4) Contact exposure by using a condenser lens which transmits the light of wavelengths λ > 350 nm at a transmittance of more than 90% and that of wavelength range 300-350 nm at a transmittance of a few percent | 500 mJ/cm$^2$ 4 J/cm$^2$ | dissolves does not dissolve |
| (5) Xe-Hg lamp (500 W) 220 nm < λ < 280 nm (filter used: CM-250, Canon Co., Ltd.) | 50 mJ/cm$^2$ | does not dissolve |

It is known that NQN is dissolved in a solution of isoamyl acetate if a crosslinking reaction does not arise.

NQN is dissolved in a solution of isoamyl acetate when NQN is exposed to light, its wavelengths below 250 nm being cut off, at the exposure amount of 2 J/cm$^2$. Therefore, in that case, no crosslinking reaction arises.

In the case of exposure to light in which the wavelengths below 300 nm are cut off, (a) when NQN is exposed with the light at the exposure amount of 300 mJ/cm$^2$, it is dissolved in the solution of isoamyl acetate, and therefore the crosslinking reaction does not arise; and (b) when NQN is exposed to light at an exposure amount of 2 J/cm$^2$, it is not dissolved in a solution of isoamyl acetate and, accordingly, the crosslinking reaction arises.

Furthermore, in a case where the photoresist of NQN is exposed to light having a wavelength range of 220-280 nm, it does not dissolve in the solution of isoamyl acetate when the exposure amount of the light if 50 mJ/cm$^2$. Therefore, crosslinking of NQN occurs.

As is understood from the above description, crosslinking of NQN efficiently occurs when the photoresist is exposed to light having a wavelength range of 220-280 nm. Crosslinking also occurs when the photoresist is exposed to light having a wavelength at or about 300 nm with the increased amount of exposure. However, it can be seen that no crosslinking of NQN occurs when the photoresist is exposed by light having a wavelength more than 350 nm.

Meanwhile, in the case of usual contact exposure with an ultra-high pressure mercury lamp, a condenser lens is used, which lens cuts off the shorter wavelengths and therefore the photoresist of NQN is exposed mainly with light having wavelengths of 436 nm (g-line), 405 nm (h-line) and 365 nm (i-line). In that case, crosslinking of NQN does not occur if NQN is exposed to the light at the usual amount of exposure (100-200 mJ/cm$^2$).

As described above, patterning of NQN can be attained by using light having a wavelength range of 350-450 nm without causing a crosslinking reaction among the molecules of NQN, which is understood from the fact that a positive type photoresist pattern is formed by using the same exposure treatment.

According to the present invention, patterning is attained without the aid of crosslinking. Therefore, photoresist patterns of high resolution are attained and the photoresist forming the patterns is easily separated or excluded by a solvent, for example, acetate, methyl isobutyl ketone, acetone or the like.

The following Comparative Examples illustrate the advantages of Applicant's methods over that of the prior art.

COMPARISON EXAMPLE I

The conventional photoresist of AZ-1305J (commercially available from Shipley corporation) was coated over a silicon wafer with a coating thickness of 1.0 μm so as to form a photoresist film. Subsequently, the photoresist film was prebaked at a temperature of 80° C. for 20 minutes, and thereafter exposed under an exposure dose of 80 mJ/cm$^2$ by the same reduction type projection apparatus as in Example I. When the exposed film was developed for 60 seconds by use of monochlorobenzene at a temperature of 23° C. as a developing solution, both the exposed portion and unexposed portion of the resist film were not dissolved, so that no photoresist pattern could be formed. This is because quinone diazide of AZ-1350J as a photosensitive agent might be converted into indene carboxylic acid, whereas naphthoquinone and a photosensitive agent were not dissolved by the nonpolar solvent such as monochlorobenzene, so that no photoresist pattern could be formed.

COMPARISON EXAMPLE II

A photoresist coating film of AZ-1350J was formed on an aluminum substrate under the same conditions as in the comparison example I, and then exposed. When the exposed photoresist film was developed with an alkaline developing solution, the photoresist pattern having a line width more than or equal to 1 μm could be fabricated, but the pattern having a line width less than 1 μm, i.e., submicrometer could not be formed.

COMPARISON EXAMPLE III

AZ-1350 J (photoresist commercially available from Shipley corporation) was applied onto a silicon wafer in a coating thickness of 1 μm to form a photoresist coating film was exposed as described in Example VII.

The exposed resist was developed by using a solution containing the AZ developing solution diluted with water at a ratio of 1:1 at a temperature of 23° C. for 20 seconds. A positive type photoresist pattern was obtained. Observing this resist pattern, it could be recognized that a 1.0 μm line and space pattern was obtained.

Then, a sample obtained by the same exposure conditions was developed with monochlorobenzene at a temperature of 23° C. for 2 minutes. However, no resist pattern was formed.

Furthermore, another sample resist film obtained by the same exposure conditions was developed with a developing solution in which 1 part by weight of isoamyl acetate is mixed with 1 part weight of isopropyl alcohol at a temperature of 23° C., but no pattern was formed. And furthermore, this resist coating film was developed only with an isoamyl acetate solution. As a result, the resist was dissolved over the wafer surface, and no pattern was formed.

As apparent from the above Examples and comparison Example, when the coating film of naphthoquinone diazide sulfonate of novolak (NQN) was exposed with near ultraviolet radiation, either negative type or positive type photoresist can be determined merely by selecting the developing solution for the exposed photoresist. The reason is considered as follows:

Quinon diazide group of NQN is decomposed by a near ultraviolet radiation, and converted into carboxylic acid. Then the polarity appears in the exposed region of NQN. The polar region is not dissolved in monochlorobenzene which is a nonpolar solvent. As a result, a negative type photoresist pattern is formed by the insoluble polar region.

To the contrary, when using a polar solvent as the developing solution, the only exposed and larger polar region of NQN is dissolved in the polar solvent, and a positive type photoresist pattern is formed by an insoluble region of NQN.

As described in the comparison Examples, in AZ-1350J which is a mixture of novolak and naphthoquinone diazide, a change of naphthoquinone diazide into carboxylic acid is the same as that of NQN. However, it may be considered that a change of polarity throughout this photoresist is small. Actually, it is impossible to form a photoresist pattern by using the difference of this polarity.

COMPARISON EXAMPLE IV

Using the same photoresist coating film on the silicon substrate as obtained in the Example I, the development was performed with various types of developing solutions. The results of the development are shown in Table 2.

TABLE 2

| | developing solution | composition (volume ratio) | property | result |
|---|---|---|---|---|
| 1st | methyl buthyl ketone, and cyclohexane | 10:5 | positive type | no photoresist pattern is formed |
| 2nd | isoamyl acetate, and cyclohexane | 10:2 | positive type | no photoresist pattern is formed |
| 3rd | dioxan, and cyclohexane | 10:4 | positive type | no photoresist pattern is formed |
| 4th | isopropyl alcohol | | positive type | no photoresist pattern is formed |

In the first to third development examples, the dissolution of the exposed portion of the photoresist coating film was done relatively faster than that of the unexposed portions thereof. The photoresist coating film represents the positive type property. The thickness of the remaining film was thinner than 0.1 μm. In the fourth development example, the unexposed portion of the photoresist coating film was not completely dissolved, whereas the thickness of the exposed portion thereof was approximately 0.1 μm.

The developing solutions used in the first to fourth development examples represent a positive type property. However, no photoresist pattern could be formed.

While the present invention has been described using a specific embodiment, it should be understood that further modifications and changes can be made without departing from the scope of the present invention.

For example, as the developing solutions, there can be used solutions other than the above-described kinds of solutions. As the positive type developing solutions, polar solvents such as methanol, isopropyl alcohol and/or the other alcohols, isoamyl acetate and/or the other acetates, methyl-butyl ketone and/or the other alkyl ketones, or other desired developing solutions may be used. These developing solutions may be used by mixing one or more solvents selected from the group consisting of these alcohols, acetates and alkyl ketones.

As the negative type developing solutions, nonpolar solvents such as monochlorobenzene, xylene, toluene, benzene, dichlorobenzene, trichlorobenzene and trichloroethylene or other preferable nonpolar solvents may be used. Mixed solutions of one or more nonpolar solvents selected from the above-mentioned group and one or more solvents selected from the group consisting of cyclohexane, n-hexane, petroleum ether and the other desired solvents may be used as the developing solutions.

Furthermore, the coating film need not be directly coated on the substrate, but on other underlying layers.

Finally, it is also possible to employ as the exposure light, electron beams, x-rays or the like having wavelengths other than 350 to 450 nm.

As previously described in detail, according to the method of forming the photoresist pattern of the invention, either positive type or negative type photoresist patterns can be formed by selecting the developing solution because of the naphthoquinone diazide sulfonate of a novolak is used, and exposed to near ultraviolet radiation in the wavelength range of 350 to 450 nm.

Accordingly, the photoresist pattern of the present invention is preferably used for manufacture of highly integrated circuits such as LSI which requires fine processing, e.g., submicrometer processing.

We claim:

1. A method of forming a negative type photoresist pattern consisting essentially of the steps of:
    forming a photoresist photosensitive coating film of a naphthoquinone diazide sulfonate of a novolak resin on an underlying layer,
    exposing a photoresist coating film by selectively irradiating with ultraviolet radiation of 350 to 450 nm through a photomask,
    developing the exposed photoresist coating film with a solution made by mixing non-polar solvents containing one or more solvents selected from the group consisting of halogen-containing solvents and alkylbenzene solvents as the major solvent with one or more solvents having a polarity smaller than that of the major solvent and selected from the group consisting of cyclohexane petroleum ether and n-hexane, thereby removing an unexposed portion of the photoresist coating film.

2. A method of forming a photoresist pattern as claimed in claim 1, wherein the halogen-containing solvent is monochlorobenzene.

3. A method of forming a photoresist pattern as claimed in claim 1, wherein the alkylbenzene solvent is xylene.

4. A method of forming a negative type photoresist pattern consisting essentially of the steps of:
- forming a photoresist photosensitive coating film of a naphthoquinone diazide sulfonate of a novolak resin on an underlying layer,
- exposing a photoresist coating film by selectively irradiating with ultraviolet radiation of 350 to 450 nm through a photomask,
- baking the exposed photoresist coating film at a temperature of 60° to 130° C.,
- developing the exposed photoresist coating film with a solution made by mixing non-polar solvents containing one or more solvents selected from the group consisting of halogen-containing solvents and alkylbenzene solvents as the major solvent with one or more solvents having polarity smaller than that of the major solvent and selected from the group consisting of cyclohexane, petroleum ether and n-hexane, thereby removing an unexposed portion of the photoresist coating film.

5. A method of forming a photoresist pattern as claimed in claim 4, wherein the halogen-containing solvent is monochlorobenzene.

6. A method of forming a photoresist pattern as claimed in claim 4, wherein the alkylbenzene solvent is xylene.

* * * * *